(12) United States Patent
Nishiyama

(10) Patent No.: US 7,724,475 B2
(45) Date of Patent: May 25, 2010

(54) CONDUCTIVE MEMBER, DISK DRIVE USING SAME, AND CONDUCTIVE MEMBER FABRICATING METHOD

(75) Inventor: Nobumasa Nishiyama, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1144 days.

(21) Appl. No.: 11/346,814

(22) Filed: Feb. 3, 2006

(65) Prior Publication Data

US 2006/0175080 A1    Aug. 10, 2006

(30) Foreign Application Priority Data

Feb. 4, 2005    (JP) ............... 2005-029631

(51) Int. Cl.
H05K 3/36 (2006.01)
G11B 5/48 (2006.01)
G11B 21/16 (2006.01)
(52) U.S. Cl. .............. 360/244.1; 174/254; 29/830
(58) Field of Classification Search ............. 360/244.1; 174/254; 29/830
See application file for complete search history.

(56) References Cited

U.S. PATENT DOCUMENTS

| 5,995,322 A | 11/1999 | Yanagihara |
| 6,380,493 B1 * | 4/2002 | Morita et al. ............... 174/258 |
| 7,272,889 B2 * | 9/2007 | Aonuma et al. ............... 29/852 |

FOREIGN PATENT DOCUMENTS

| JP | 2002-009203 | 1/2002 |
| JP | 2002-251706 | 9/2002 |
| JP | 2003-152404 | 5/2003 |

* cited by examiner

Primary Examiner—Jeremy C Norris
(74) Attorney, Agent, or Firm—Townsend and Townsend and Crew LLP; John Henkhaus

(57) ABSTRACT

Embodiments of the present invention provide a conductive member, in which electric characteristics can be improved by matching impedance all the way from a conductive wire to a pad. In one embodiment, a conductive member comprises: a back side metal layer; an insulating layer formed on the back side metal layer; a conductive wire formed on the insulating layer; and a pad formed on the insulating layer and electrically connected to the conductive wire; at least one opening and at least one supporting structure being formed at a position corresponding to the pad on the back side metal layer.

17 Claims, 3 Drawing Sheets

CONDUCTIVE MEMBER, DISK DRIVE USING SAME, AND CONDUCTIVE MEMBER FABRICATING METHOD

CROSS-REFERENCES TO RELATED APPLICATIONS

This application claims priority from Japanese Patent Application No. JP2005-029631, filed Feb. 4, 2005, the entire disclosure of which is incorporated herein by reference.

BACKGROUND OF THE INVENTION

The present invention relates to a conductive member to be used inside of a disk drive such as a hard disk.

In recent years, a hard disk has been progressively reduced in size, and accordingly, various kinds of members to be used inside of the hard disk also have been progressively reduced in size and thickness.

For example, a magnetic head assembly for reading and writing data from and on a magnetic medium in a hard disk includes a magnetic head and a preamp pre-amplifying circuit, which is electrically connected to the magnetic head and amplifies a signal read by the magnetic head. The magnetic head and the preamp pre-amplifying circuit are made of a conductive member called an inter-connect (i.e., an integrated lead suspension abbreviated as "an ILS").

The conductive member includes a metal layer serving as a back side (i.e., a back side metal layer), a polyimide layer formed at either surface of the metal layer (i.e., an insulating layer), and a conductive wire formed on the polyimide layer. A substantially rectangular pad is formed on a side, of the conductive wire, for connection to the preamp pre-amplifying circuit. The pad is introduced to a position perpendicular to the plane of a flexible substrate having the preamp pre-amplifying circuit mounted thereon, and further, is electrically connected to a terminal on the side of the flexible substrate by using a conductive material such as a solder.

Patent Literature 1 (Japanese Patent Laid-open No. 2002-9203) discloses the technique of forming an insulating layer on a wiring board for use in the above-described hard disk or the like.

Moreover, Patent Literature 2 (Japanese Patent Laid-open No. 2003-152404) discloses the technique of forming a back side metal layer so as to reduce a transmission loss in a transmission line.

Patent Literature 2 discloses that a line loss is reduced by forming a hole at the back side metal layer right under a conductive wire. The hole is formed across two conductors so as to enhance differential transmission characteristics of the transmission line.

BRIEF SUMMARY OF THE INVENTION

However, the above-described conductive members in the prior art involves capacitance that is generated between the pad having a given area and the back side metal layer disposed with respect to the pad via the insulating layer. The pad must have the given area from the viewpoint of soldering or the like, thereby suffering from decreased reactance. In this manner, impedance is decreased in the vicinity of the pad caused by the combination of two factors: the decreased reactance and the increased capacitance. This has raised a problem of degradation of electric characteristics due to occurrence of mismatch of the impedance between the conductive wire and the pad.

The present invention has been accomplished in view of the above-described situation. A feature of the present invention is to provide a conductive member, in which electric characteristics can be improved by matching impedance all the way from a conductive wire to a pad.

According to the present invention, in order to solve the above-described problems experienced by the prior art, a conductive member comprises: a back side metal layer; an insulating layer formed on the back side metal layer; a conductive wire formed on the insulating layer; and a pad formed on the insulating layer and electrically connected to the conductive wire; wherein the back side metal layer is formed with at least one opening and at least one supporting structure whose position are associated with the pad.

DETAILED DESCRIPTION OF THE INVENTION

Figure 1:
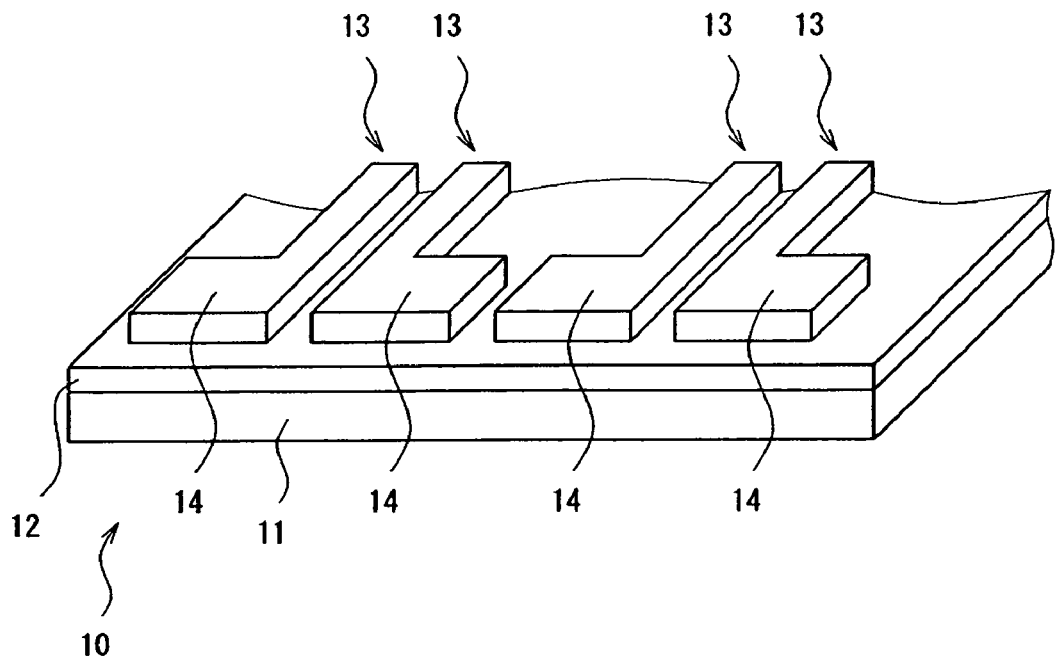
FIG. 1 is a perspective view showing a conductive member in an embodiment according to the present invention.

An embodiment according to the present invention will be described below in reference to the accompanying drawings. A conductive member 10 in a present embodiment is incorporated in a magnetic disk drive such as a hard disk. As shown in FIG. 1, the conductive member 10 includes a metal layer serving as a back side (i.e., a back side metal layer) 11, a polyimide layer formed at either surface of the metal layer (i.e., an insulating layer) 12, and a conductive wire 13 formed on the polyimide layer 12. A plurality of substantially rectangular pads 14, (i.e., rectangular pads), are formed on the side, of the conductive wires 13, for connection to a preamp pre-amplifying circuit.

Figure 2:
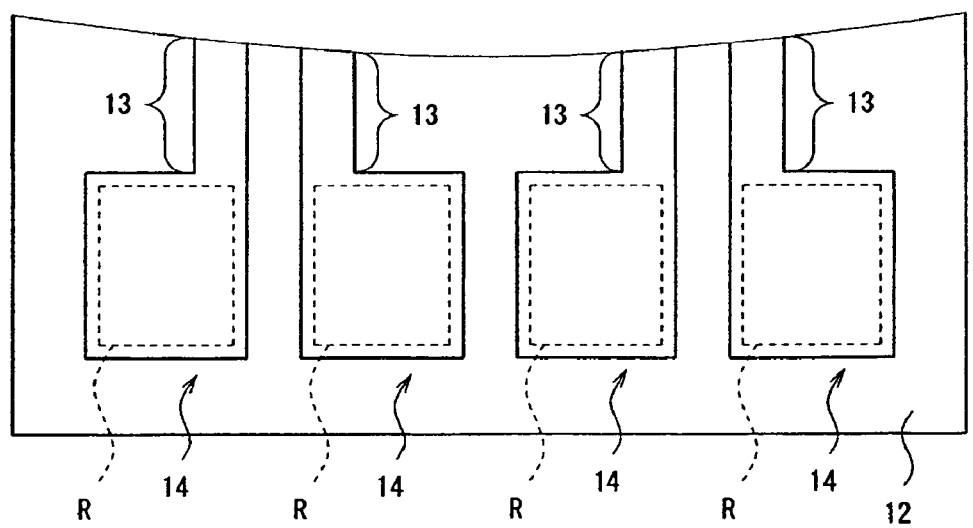
FIG. 2 is a plan view showing the conductive member in the embodiment according to the present invention.

According to one aspect in the present embodiment, the back side metal layer 11 is formed with an opening by removing at least a part of a portion associated with the pad 14 thereon. More specifically, as shown in FIG. 2, one example of the conductive member 10 in the present embodiment is such that the back side metal layer 11 is formed with an opening by removing a region (R) which at least partly overlaps with a region associated with the back side of the pad 14 thereon by etching or the like. FIG. 2 is a plan view showing the vicinity of the pad 14, wherein the region (R) which defines the opening provided in the back side metal layer 11 is indicated by broken lines.

Incidentally, when the conductive member 10 is manufactured in a normally fabricating process, the conductive wire 13 and the pad 14 are formed, and then a pin serving as a probe may be brought into press-contact with the pad 14 to examine a conductive state. At this time, since the back side metal layer 11 has the opening formed thereon, there may be a possibility of breakage of the pad 14 caused by an unsatisfactory mechanical strength of the pad 14 depending on a press-contact force.

Figure 3:
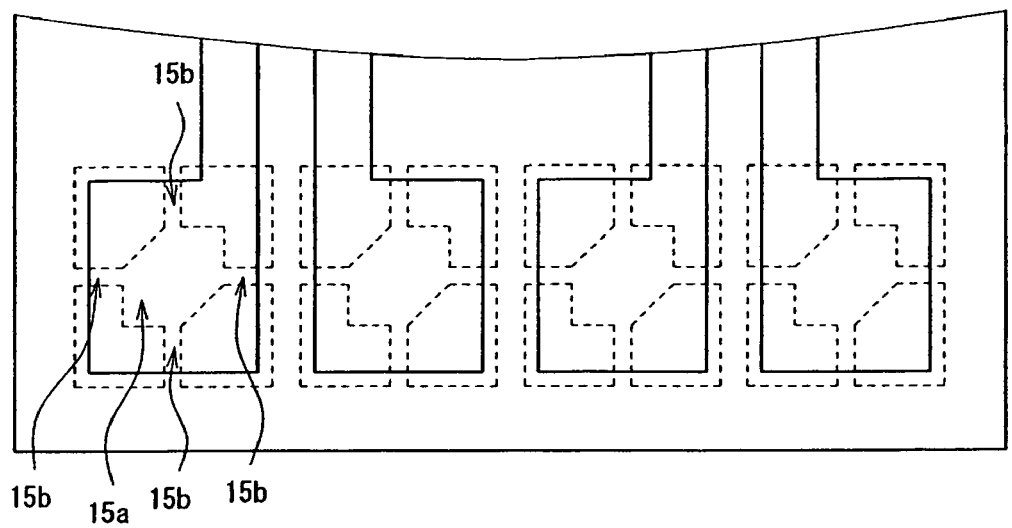
FIG. 3 is a plan view showing the conductive member in the embodiment according to the present invention from another aspect.

In view of this, according to another aspect in the present embodiment, a supporting structure 15 and at least one opening are formed at a position associated with the pad 14 (at least a part of a region associated with the pad 14) on the back side metal layer 11, as shown in FIG. 3. The supporting structure 15 includes an island-like region 15a, which is located near the center of the pad 14 and has an area smaller than that of the pad 14. That is to say, the island-like region 15a mainly includes a portion, with which a pin serving as a probe is brought into press-contact, on the pad 14. The island-like region 15a does not always need to be formed into a rectangular shape. It may be formed into a shape without a pair of corners facing each other on a diagonal line, as shown in FIG. 3.

Furthermore, the supporting structure 15 includes beams 15b for supporting the island-like region 15a. In this manner, the beams 15b are adapted to connect the island-like region 15a to the back side metal layer 11 around the opening.

In the meantime, it is desirable to dispose the supporting structure 15 in each of the pads 14 in the case where the supporting structure 15 is disposed on the back side metal layer 11 in order to alleviate the interference between the pads 14. For example, in the case where the supporting structure 15 is commonly used between the adjacent pads 14, cross-coupling is increased between the adjacent pads 14, thereby causing noise induction. In this case, the cross-coupling can be reduced by separating the supporting structure 15.

Since the conductive member 10 in the present embodiment is such configured as described above, the area of the metallic portion facing the pad 14 can be reduced, and further, the capacitance due to the pad 14 can be reduced. Thus, the impedance can be reduced.

Figure 4:
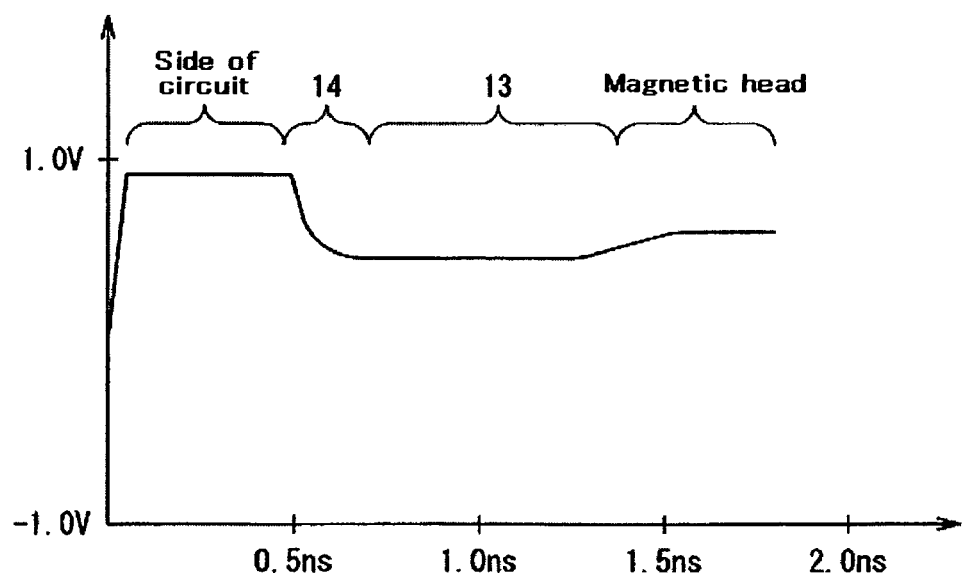
FIG. 4 is a diagram illustrating an example of impedance at a conductive wire and a pad on the conductive member in the embodiment according to the present invention.

FIG. 4 schematically illustrates an example of the impedance in the conductive member 10 in the present embodiment. As illustrated in FIG. 4, the impedances of the conductive wire 13 and the pad 14 formed on the conductive member 10 in the present embodiment are substantially constant as a whole. The example of the impedance illustrated in FIG. 4 is obtained by outputting a measuring signal, measuring a reflective wave, and plotting the intensity of the signal at a timing at which the reflective wave reaches.

A method for fabricating the conductive member 10 in the present embodiment according to the above-described aspect comprises the following steps:

(1) forming the insulating layer 12 on the back side metal layer 11;

(2) forming the conductive wire 13 and the pad 14 to be electrically connected to the conductive wire 13 on the insulating layer 12; and (3) forming the back side metal layer 11 with the opening whose position is associated with the pad 14 (i.e., the region right under the pad 14) except for the portion having the predetermined shape equivalent to the shape of the supporting structure 15.

In this manner, the back side metal layer 11 is formed with the opening including the supporting structure 15 at the position associated with the pad 14.

Figure 5:
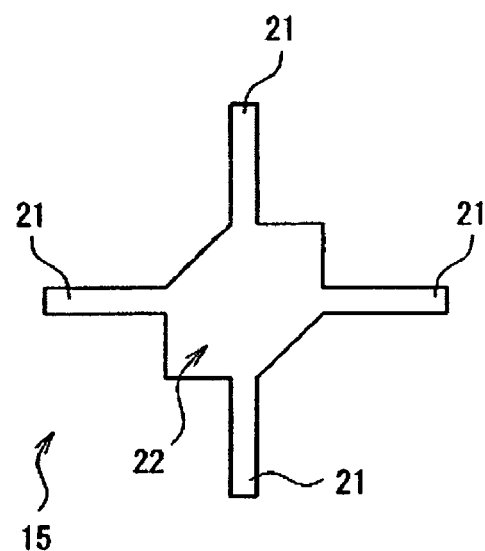
FIG. 5 is a plan view showing an example of a supporting structure which is separately formed.

In the method for fabricating the conductive member 10 in the present embodiment according to another aspect, for example, the back side metal layer 11 may be formed with a rectangular opening having a predetermined size at the position associated with the pad 14, and thereafter, a supporting structure having a predetermined shape, which is fabricated as a separate member, may be fixingly set inside of the rect-angular opening. A method for fabricating the conductive member 10 according to this aspect comprises the following steps:

(1) forming the insulating layer 12 on the back side metal layer 11;

(2) forming the conductive wire 13 and the pad 14 to be electrically connected to the conductive wire 13 on the insulating layer 12;

(3) forming the back side metal layer 11 with the opening whose position is associated with the pad 14 (i.e., the region right under the pad 14);

(4) separately forming a member serving as a supporting structure 15, wherein in one example, in the case where the back side metal layer 11 is formed with a substantially rectangular opening, the supporting structure 15 may be formed into a substantial cross-shape including beams 21 and an island-like region 22, as shown in FIG. 5, the length of each beam 21 being equal to that of each of sides of the rectangle at the circumferential edge of the opening formed on the back side metal layer 11, whereby the supporting structure 15 can be fitted into the opening formed on the back side metal layer 11; and (5) fitting the separately formed supporting structure 15 into the opening formed on the back side metal layer 11, so as to fix it at the circumferential edge of the opening.

In this manner, the supporting structure 15 having the predetermined shape is formed inside of the opening formed on the back side metal layer 11.

Incidentally, in the present embodiment according to the above-described aspect, the material of the separately formed supporting structure 15 may be the same as or different from that of the back side metal layer 11.

Figure 6:
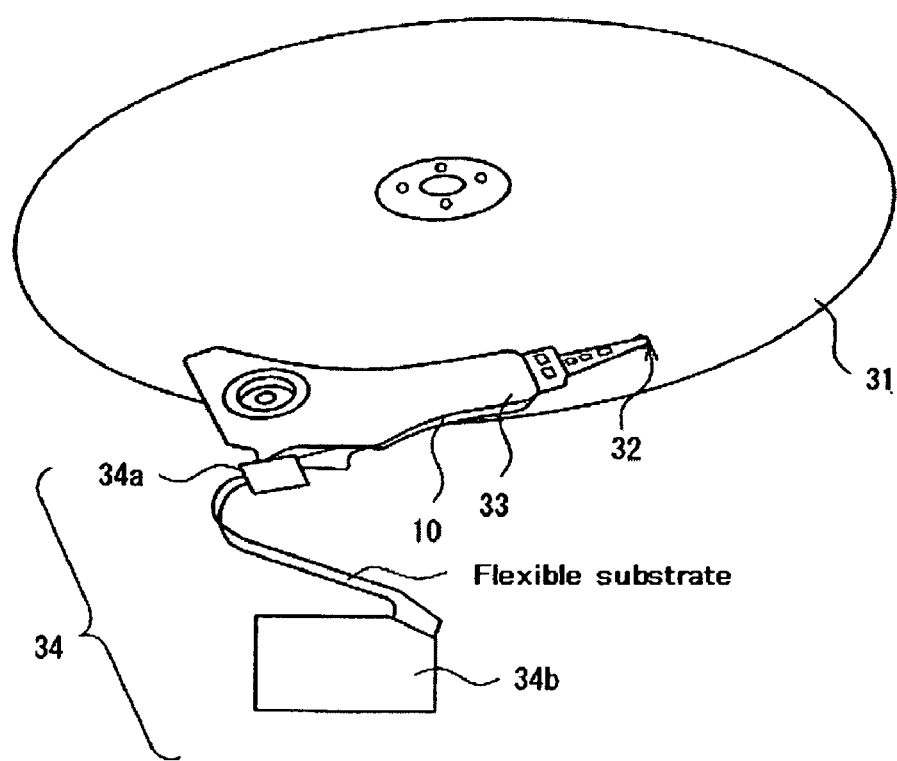
FIG. 6 is a schematic view showing a disk drive in the embodiment according to the present invention from a further aspect.

Subsequently, a description will be given below of a disk drive in the present embodiment according to a further aspect. As shown in FIG. 6, a disk drive includes a magnetic disk medium 31, a magnetic head 32, an arm and suspension magnetic head support 33 and a circuit unit 34. Here, the magnetic head 32 and the circuit unit 34 are electrically connected to each other by the use of the above-described conductive member 10.

The magnetic head 32 flies above the magnetic disk medium 31, moves relatively to the magnetic disk medium 31, and further, outputs information magnetically recorded on the magnetic disk medium 31 as an electric signal. The magnetic head 32 also generates a magnetic field based on a recording signal received as an electric signal to magnetically record information on the magnetic disk medium 31. Moreover, the magnetic head 32 is supported by the arm and suspension magnetic head support 33.

The conductive wire 13 and the pad 14 incorporated in the conductive member 10 are adapted to transmit the electric signal, which is input into or output from the magnetic head 32. Each of the terminals disposed on the circuit unit 34 is welded to the corresponding pad 14 by soldering or the like.

The circuit unit 34 includes a pre-amplifier 34a and a control circuit 34b. The pre-amplifier 34a amplifies the electric signal, which is input into or output from the magnetic head 32. The control circuit 34b outputs, to a personal computer unit serving as a host, a signal obtained by converting an electric signal output from the pre-amplifier 34a into an electric signal having a predetermined format. Further, the control circuit 34b outputs an input signal transmitted from the host to the pre-amplifier 34a. Here, the pre-amplifier 34a is fixed to the arm and suspension magnetic head support 33. According to the present embodiment, the conductive member 10 is connected to the pre-amplifier 34a included in the circuit unit 34.

In the above-described disk drive, the electric signal output from the magnetic head 32 is transmitted to the pad 14 via the conductive wire 13 on the conductive member 10, and further, is transmitted toward the pre-amplifier 34a via the pad 14. At least a part of the portion, facing the pad 14, on the back side metal layer 11 in the conductive member 10 is removed at this time, thereby reducing a floating capacitance of the pad 14. As a consequence, it is possible to prevent any decrease in impedance of the pad 14, so as to match the impedance of the conductive wire 13 with the impedance of the pad 14.

Thus, distortion such as a reflective wave hardly occurs in the electric signal transmitted between the magnetic head 32 and the circuit unit 34, thereby reducing an error rate of the signal.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A conductive member comprising:
   a back side metal layer;
   an insulating layer formed on the back side metal layer;
   a conductive wire formed on the insulating layer; and
   a pad formed on the insulating layer and electrically connected to the conductive wire;
   wherein the back side metal layer is formed with at least one opening and at least one supporting structure whose positions are associated with the pad.

2. A conductive member as claimed in claim 1, wherein the back side metal layer is formed with the opening and the supporting structure with a part excluding a portion to serve as the supporting structure removed.

3. A conductive member as claimed in claim 1, wherein the back side metal layer is formed with one opening whose position is associated with the pad, and subsequently, the supporting structure is defined in such a manner as to be set inside of the opening.

4. A conductive member as claimed in claim 1, wherein the at least one supporting structure partly includes an island-like region.

5. A conductive member as claimed in claim 4, wherein the island-like region is smaller in area than the at least one opening of the back side metal layer.

6. A conductive member as claimed in claim 4, wherein the at least one supporting structure further includes a plurality of beams connecting the island-like region with the back side metal layer.

7. A conductive member as claimed in claim 1, wherein the at least one supporting structure and the back side metal layer are made of the same material.

8. A disk drive comprising a magnetic head and a circuit unit, which are electrically connected to each other by the use of the conductive member as claimed in claim 1.

9. A method for fabricating a conductive member comprising:
   forming a conductive wire on an insulating layer formed on a back side metal layer;
   forming, on the insulating layer, a pad to be electrically connected to the conductive wire;
   forming the back side metal layer with an opening whose position is associated with the pad with a portion having a predetermined shape left; and
   forming the back side metal layer with an opening including a supporting structure having the predetermined shape at the position where the opening is associated with the pad.

10. A method as claimed in claim 9, wherein the supporting structure partly includes an island-like region.

11. A method as claimed in claim 10, wherein the island-like region is smaller in area than the opening of the back side metal layer.

12. A method as claimed in claim 10, wherein the supporting structure further includes a plurality of beams connecting the island-like region with the back side metal layer.

13. A method for fabricating a conductive member comprising:
   forming a conductive wire on an insulating layer formed on a back side metal layer;
   forming, on the insulating layer, a pad to be electrically connected to the conductive wire;
   forming the back side metal layer with an opening whose position is associated with the pad; and
   setting a supporting structure having a predetermined shape inside of the formed opening.

14. A method as claimed in claim 13, wherein the supporting structure partly includes an island-like region.

15. A method as claimed in claim 14, wherein the island-like region is smaller in area than the opening of the back side metal layer.

16. A method as claimed in claim 14, wherein the supporting structure further includes a plurality of beams connecting the island-like region with the back side metal layer.

17. A method as claimed in claim 13, wherein the supporting structure and the back side metal layer are made of the same material.

* * * * *